(12) United States Patent
Shin

(10) Patent No.: US 6,476,440 B1
(45) Date of Patent: Nov. 5, 2002

(54) NONVOLATILE MEMORY DEVICE AND METHOD OF MANUFACTURING THE SAME

(75) Inventor: Bong Jo Shin, Chungcheongbuk-do (KR)

(73) Assignee: Hyundai Electronics Industries Co., Inc., Ichon-shi (KR)

( * ) Notice: Subject to any disclaimer, the term of this patent is extended or adjusted under 35 U.S.C. 154(b) by 72 days.

(21) Appl. No.: 09/642,591

(22) Filed: Aug. 22, 2000

(30) Foreign Application Priority Data

Aug. 24, 1999 (KR) .............................. 99/35162

(51) Int. Cl.⁷ .................. H01L 29/788; H01L 21/336
(52) U.S. Cl. .................. 257/320; 257/316; 257/319; 257/321; 438/257; 438/264; 438/283
(58) Field of Search .................. 257/319, 320, 257/321, 316; 438/257, 264, 266, 283, 593, 594

(56) References Cited

U.S. PATENT DOCUMENTS

| | | | | | |
|---|---|---|---|---|---|
| 4,437,172 A | * | 3/1984 | Masuoka | ............... | 365/185.14 |
| 4,462,090 A | * | 7/1984 | Iizuka | ........................ | 365/185 |
| 4,561,004 A | * | 12/1985 | Kuo et al. | ................... | 257/319 |
| 5,053,841 A | * | 10/1991 | Miyakawa et al. | .... | 365/185.05 |
| 5,354,702 A | * | 10/1994 | Arima et al. | ................. | 27/318 |
| 5,668,757 A | * | 9/1997 | Jeng | ........................ | 365/185.1 |
| 5,723,888 A | * | 3/1998 | Yu | ............................. | 257/319 |
| 6,271,091 B1 | * | 8/2001 | Park | ........................... | 438/267 |
| 6,331,721 B1 | * | 12/2001 | Sung et al. | ................. | 257/317 |

* cited by examiner

*Primary Examiner*—Matthew Smith
*Assistant Examiner*—Lex H. Malsawma
(74) *Attorney, Agent, or Firm*—Fleshner & Kim, LLP

(57) ABSTRACT

A nonvolatile memory device includes: a first insulating film, a selection gate, a second insulating film and an erase gate layered on a semiconductor substrate; sidewalls formed in contact with both sides of the selection gate, the erase gate and the second insulating film; a third insulating film formed over an upper surface and an edge of the erase gate; a fourth insulating film formed on the surface of the semiconductor substrate in contact with the sidewalls; a floating gate overlapping the erase gate at a certain width; a dielectric film formed on the floating gate; a source/drain formed in the semiconductor below the floating gate and one of the sidewalls; and a control gate formed on the entire surface including the erase and floating gate.

22 Claims, 5 Drawing Sheets

|  | $V_S$ | $V_D$ | $V_{CG}$ | $V_{EG}$ | $V_{SG}$ |
|---|---|---|---|---|---|
| Program | 0 | 6V | 12V | 0 | 12V |
| Erase | 0 | 0 | 0 | 18V | 0 |
| Read | 0 | 2V | 5V | 0 | 5V |

NONVOLATILE MEMORY DEVICE AND METHOD OF MANUFACTURING THE SAME

BACKGROUND OF THE INVENTION

1. Field of the Invention

The present invention relates to a semiconductor memory device and, more particularly, to a nonvolatile memory device and method of manufacturing the same which simultaneously forms a selection gate and an erase gate, and reduces a cell size.

2. Background of the Related Art

Generally, a nonvolatile memory device maintains information stored in a cell even in case of power being turned off. Examples of the nonvolatile memory device include Mask ROMs, PROMs, EPROMs, EEPROMs and Flash memory.

Particularly, there are two types of the Flash memory, an NOR type and a NAND type. A certain number of source/drains are shared by buried N+(BN+) lines in the NOR type Flash memory, while a source in one cell and a drain in a next cell are shared in the NAND type Flash memory.

Meanwhile, in the nonvolatile memory device, to "erase" memory data refers to an action of discharging electrons in a floating gate, and to "program", on the other hand, refers to an action of injecting electrons to the floating gate. Additionally, a gate constructed as an erase gate, by making erasing functions of a control gate independent, is referred to as a split gate.

A related art nonvolatile memory device and method of manufacturing the same will be explained with reference to the accompanying drawings.

FIG. 1 shows a structure of a related art nonvolatile memory device. As shown in FIG. 1, the related art nonvolatile memory device has a split gate structure including a floating gate 15, a control gate 17 and an erase gate 20.

FIGS. 2a to 2d show process steps of a related art nonvolatile memory device. As shown in FIG. 2a, a gate oxide film 12 is formed on a surface of a semiconductor substrate 11, and a first CVD oxide film 13 is in turn formed on the gate oxide film 12. The first CVD oxide film 13 is then selectively etched using a buried N+ mask. In this process, the gate oxide film 12 is used as a tunnel oxide film during program.

Subsequently, a first sidewall 14 is formed in contact with both sides of the first CVD oxide film 13 by depositing an insulating film on the first CVD oxide film 13 and performing etch-back to the entire surface. A buried layer of high density (not shown) is then formed on the surface of the semiconductor substrate 11 at both sides of the sidewall 14 by ion implantation using the buried N+ mask.

As shown in FIG. 2b, a first polysilicon is formed on the surface of the gate oxide film 12 including the sidewall 14 and the first CVD oxide film 13. Then, a floating gate 15 is formed by selectively etching the first polysilicon. Subsequently, an inter poly oxide film 16 is deposited on the floating gate 15.

As shown in FIG. 2c, a control gate 17 including a gate cap insulating film 18 is formed by depositing and selectively etching a second polysilicon and a second CVD oxide film on the inter poly oxide film 16.

As shown in FIG. 2d, a second sidewall 19 is formed in contact with both sides of the control gate 17 by depositing an insulating film on the control gate 17 and performing etch-back. An erase gate 20 is then formed by depositing and selectively etching a third polysilicon on the entire surface including the second sidewall 19.

In the aforementioned nonvolatile memory device, programming operation is performed when hot electrons are implanted to the floating gate, and erasing operation is then performed when electrons of the floating gate are moved to the erase gate.

However, the related art nonvolatile memory device and method of manufacturing it has several problems.

First, since a hot hole generated by band to band tunneling during the erase action is trapped in a tunnel oxide film, leakage current between the control gate and the semiconductor substrate is increased.

Moreover, since each gate forming process is proceeded without being aligned and the erase gate is formed independently, the size of the memory device increases.

SUMMARY OF THE INVENTION

Accordingly, the present invention is directed to a nonvolatile memory device and method of manufacturing the same that substantially obviates one or more of the problems due to limitations and disadvantages of the related art.

An object of the present invention is to provide a nonvolatile memory device and method of manufacturing the same simultaneously forming a selection gate and an erase gate, and reducing the cell size.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile memory device includes: a first insulating film, a selection gate, a second insulating film and an erase gate layered on a semiconductor substrate; sidewalls formed in contact with both sides of the selection gate, the erase gate and the second insulating film; a third insulating film formed over an upper surface and an edge of the erase gate; a fourth insulating film formed on the surface of the semiconductor substrate in contact with the sidewalls; a floating gate overlapping the erase gate at a certain width; a dielectric film formed on the floating gate; a source/drain formed in the semiconductor below the floating gate and one of the sidewalls; and a control gate formed on the entire surface including the erase and floating gate.

In another aspect, the method of manufacturing the nonvolatile memory device according to the present invention includes the steps of: layering a first insulating film, a first conductive layer, a second insulating film and a second conductive layer; forming an erase gate having the second conductive layer and a selection gate having the first conductive layer in a first direction by patterning the second conductive layer, the second insulating film, the second conductive layer and the first insulating film; forming a third insulating film on the entire surface including the selection and erase gate and etching back the third insulating film to form sidewall in contact with both sides of the layered selection gate and erase gate; forming a fourth insulating film on an upper surface and an edge of the erase gate; forming a floating gate overlapping the erase gate at a certain width by forming and patterning a third conductive layer on the fourth insulating film; forming a fifth insulating film on the floating gate; forming a source/drain region in a surface of the semiconductor substrate using the floating gate and the erase gate including the sidewalls as masks; and forming a fourth conductive layer on the entire surface including the floating gate and the erase-gate and patterning the fourth conductive layer to form a control gate in a second direction perpendicular to the gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A nonvolatile memory device according to an embodiment of the present invention will be described with reference to FIG. 3.

Figure 1:
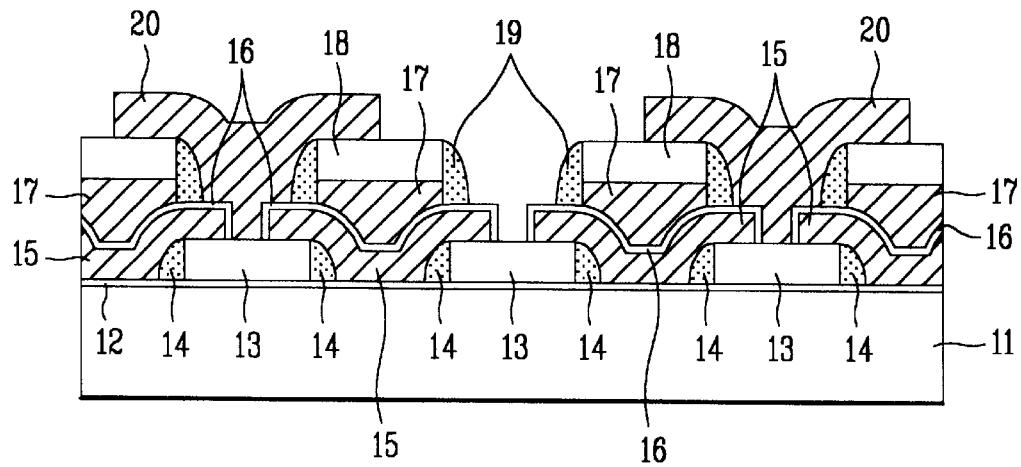
FIG. 1 is a sectional view showing a structure of a related art nonvolatile memory device.
Figure 2A:
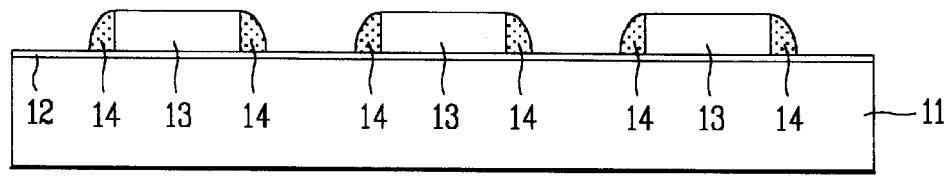
FIGS. 2a to 2d are sectional views showing process steps of a related art nonvolatile memory device.
Figure 2B:
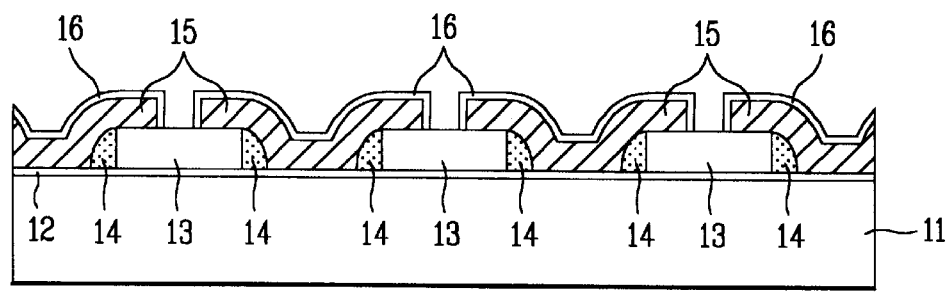
Figure 2C:
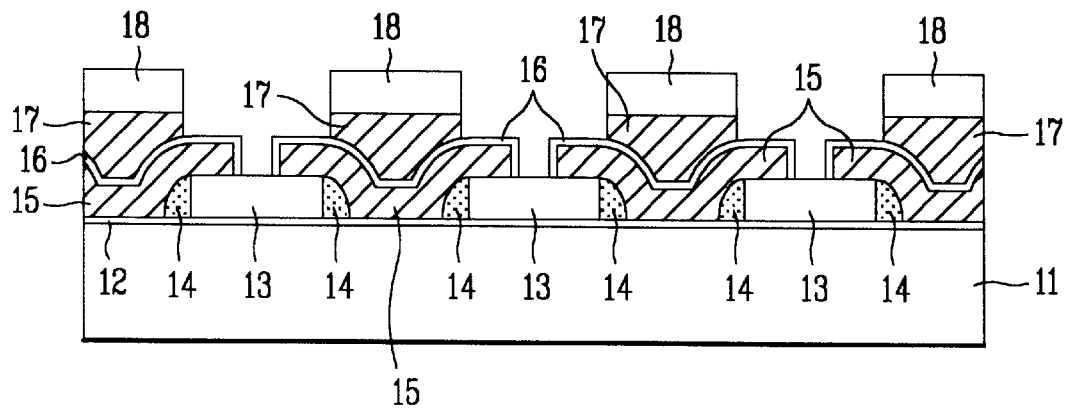
Figure 2D:
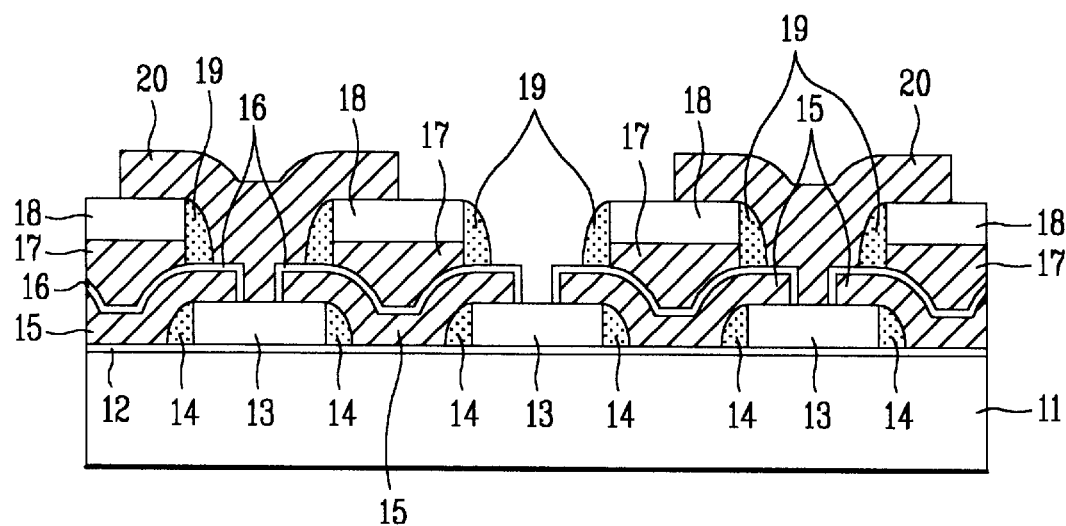
Figure 3:
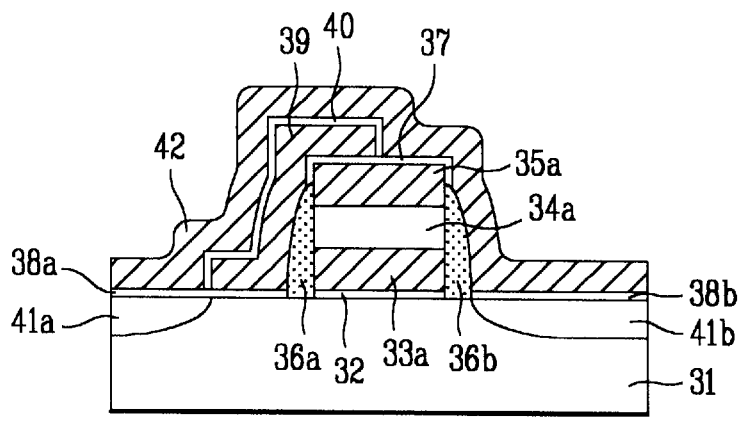
FIG. 3 is a sectional view showing a structure of a nonvolatile memory device according to an embodiment of the present invention.

As shown in FIG. 3, a first gate oxide film 32 for a selection gate is formed on a surface of a semiconductor substrate 31, and a selection gate 33a is formed on the first gate oxide film 32.

A CVD oxide film 34a is formed on the selection gate 33a, on which an erase gate 35a is formed. The selection gate 33a, the CVD oxide film 34a, and the erase gate 35a are aligned at the same width. Thereafter, sidewalls 36a, 36b are formed at both sides of the selection and erase gates 33a and 35a and the CVD oxide film 34a.

Meanwhile, the sidewalls 36a, 36b are formed so that upper edge portions of the erase gate 35a are exposed. Additionally, a second gate oxide film 37 for the erase gate is formed on the upper surface and edge portions of the erase gate 35a in contact with the upper portions of the sidewalls 36a and 36b. The third gate oxide films 38a and 38b are formed on the surface of the semiconductor substrate 31 at both sides of the sidewalls 36a and 36b.

A floating gate 39 is then formed at one side of the erase gate 35a overlapped the erase gate 35a at a certain width. At this time, the floating gate 39 is in contact with the sidewall 36a and the second gate oxide film 37.

A control gate 42 is then formed on the entire surface including the erase gate 35a and floating gate 39.

Source/drains 41a and 41b are formed in the semiconductor substrate 31 at both sides of the floating gate 39 and the sidewall 36b respectively.

The second gate oxide film 37 is used as a tunnel oxide film for erasing, between the erase gate 35a and the floating gate 39, while the third gate oxide film 38a is used as a tunnel oxide film for programming, between the floating gate 39 and channel region.

Moreover, an ONO (Oxide-Nitride-Oxide) film 40 is formed between the floating gate 39 and the control gate 42.

The sidewalls 36a and 36b are thicker than the second gate oxide film 37.

The CVD oxide film 34 formed between the selection gate 33a and the erase gate 35a has the thickness similar to those of the selection gate 33a and the erase gate 35a, and is used as an insulating film between the gates 33a and 35a when the memory device is in operation.

The second gate oxide film 37 formed over the side corners of the erase gate 35a increases a tunneling current during erasing operation.

A method of manufacturing the aforementioned nonvolatile memory device according to the present invention will be described with reference to FIGS. 4a to 4e.

Figure 4A:
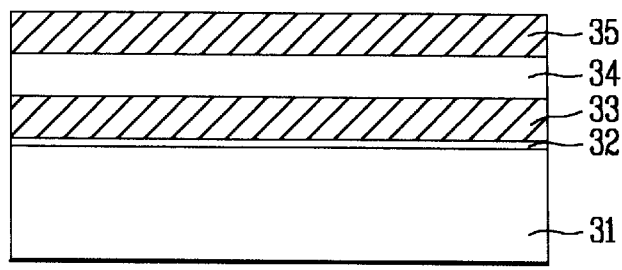
FIGS. 4a to 4e are sectional views showing process steps of a nonvolatile memory device according to the present invention.

As shown in FIG. 4a, a buffer oxide film (not shown) with a thickness of 200Å is formed on the surface of the semiconductor substrate 31. The buffer oxide film is then removed after a boron or $BF_2$ ion is implanted for adjustment of a threshold voltage (Vt) An ion implantation doping profile of the boron or $BF_2$ ion is $3 \times 10^{12}$/cm and adjusts the threshold voltage of a selection gate transistor (SG Tr.) and a floating gate transistor (FG Tr.) which will be formed in the later process.

The first gate oxide film 32 is then formed on the surface of the semiconductor substrate 31, and the first conductive layer, that is, the first polysilicon 33 is deposited on the first gate oxide film 32. The first polysilicon 33 has a thickness of 1500~2000Å, and is processed with $POCl_3$ to have a characteristic of an electrode.

Additionally, the first gate oxide film 32 is for the selection gate, and the first polysilicon 33 is used as a selection gate.

Subsequently, a CVD oxide film 34 having a thickness of 1500~2000Å is formed on the first polysilicon 33 by the CVD process, and a second conductive layer or a second polysilicon 35 is deposited on the CVD oxide film 34.

At this time, the second polysilicon 35 has a thickness of 1500~2000Å, and is processed with $POCl_3$ to have a characteristic of an electrode.

Figure 4B:
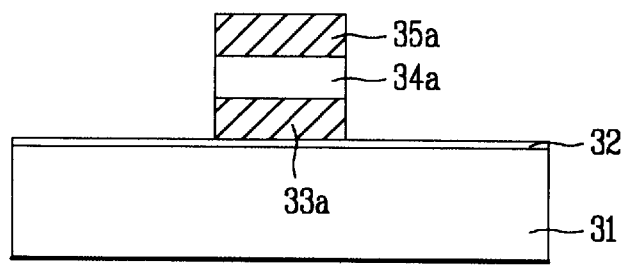

As shown in FIG. 4b, a photoresist (not shown) is deposited on the first gate oxide film 32 and patterned by an exposing and developing process.

The second polysilicon 35, the CVD oxide film 34, and the first polysilicon 33 are then selectively etched using the patterned photoresist as a mask, to form the selection gate (SG) 33a and the erase gate (EG) 35a which are insulated from each other by an interleave insulating film. At this time, the selection gate 33a and erase gate 35a are self-aligned and formed in a same direction by patterning them at the same time.

Figure 4C:
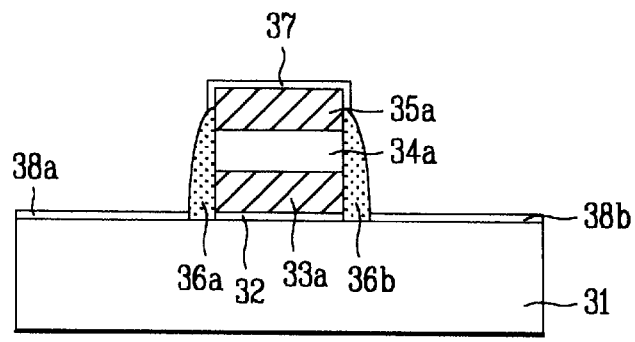

As shown in FIG. 4c, a CVD oxide film (2500Å) for forming sidewalls is formed on the entire surface of the semiconductor substrate 31 including the erase gate 35a and etch-backed, so as to form sidewalls 36a and 36b in contact with both sides of the erase gate 35a and the selection gate 33a including the interleave insulating film 34a.

At this time, a certain portion of the edges including an upper plane of the erase gate 35a is exposed, and the surface of the semiconductor substrate 31 at both sides of the sidewalls 36a and 36b is also exposed after the etch-back process. The exposed surface is then oxidized.

Subsequently, a second gate oxide film 37 for the erase gate is formed on the upper surface of the erase gate 35a and on the exposed portion at a thickness of 200~250Å, and third gate oxide films 38a and 38b for the floating gate are formed on the surface of the semiconductor substrate 31 at a thickness of 150Å. The sidewalls 36a and 36b are thicker as a certain width than the second gate oxide film 37, and are used as a poly to poly FN tunneling oxide film in an erasing operation. Additionally, the third gate oxide films 38a and 38b simultaneously formed are used as a tunnel oxide film in an programming operation.

Figure 4D:
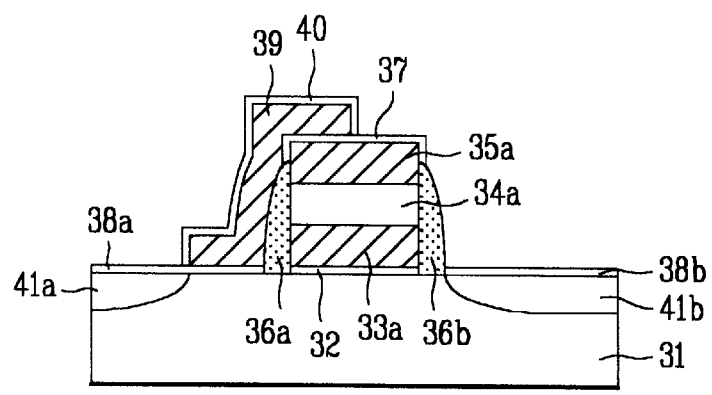

As shown in FIG. 4d, a third conductive layer for the floating gate or a third polysilicon (not shown) is deposited on the entire surface of the second and third gate oxide films 37, 38a and 38b and the sidewalls 36a and 36b, and P+ ion is doped on the third polysilicon at a density of $1 \times 10^{15}/cm^2$. At this time, the third polysilicon has a thickness of 1500~2000Å.

A photoresist (not shown) is then deposited on the third polysilicon and patterned by an exposing and developing process. Then, the third polysilicon is selectively etched using the patterned photoresist as a mask to form a floating gate 39.

At this time, the floating gate 39 overlaps the erase gate 35a by a certain width, and is formed in contact with the second and third gate oxide films 37 and 38a and the sidewall 36a.

Subsequently, an ONO film 40 is formed on. the entire surface including the floating gate 39, and is selectively removed to remain on the surface of the floating gate.

At this time, the ONO film is layered at a thickness of 55Å/170Å/80Å by the CVD process, and is used as a dielectric layer to increase the coupling rate between each gate capacitor.

An As ion is heavily doped using the erase gate 35a including the sidewalls 36a and 36b and the floating gate as masks to form source/drains 41a and 41b. The As ion has a doping profile of $5 \times 10^{15}/cm^2$ and ion implantation energy of 60keV.

Figure 4E:
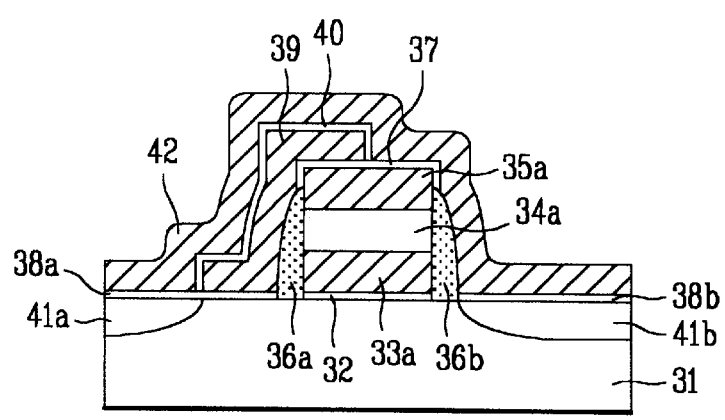
Figures 5A, 5B:
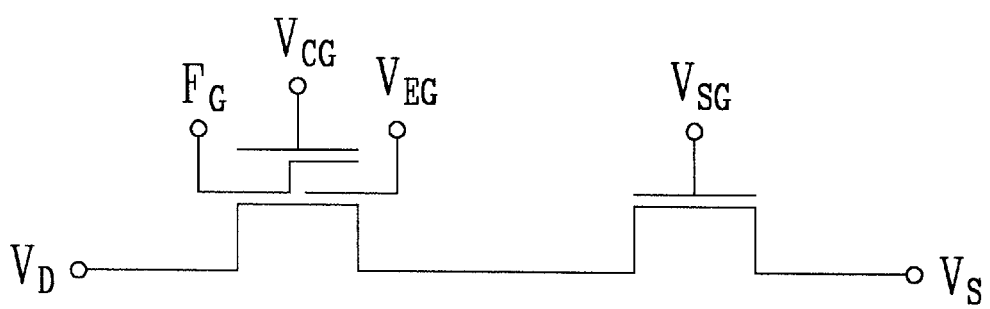
FIG. 5a is an equivalent circuit diagram of a nonvolatile memory device according to an embodiment of the present invention.
FIG. 5b shows an operation voltage of each gate in an operation mode.

As shown in FIG. 4e, a fourth conductive layer or a fourth polysilicon (not shown) is formed on the floating gate 39. The fourth polysilicon has a thickness of 2000~3000Å.

The fourth polysilicon is selectively patterned and processed with $POCl_3$ to form a control gate 42.

The ONO film 40 increases the coupling rate of each gate capacitor to determine a voltage of the control gate 42 for driving the floating gate 39 and reduce the time required for programming.

The operation of the aforementioned nonvolatile memory device according to the present invention will be described below.

First, if there is no electron in the floating gate 39, the voltage applied to the control gate 42 and the drain 41a induces electrons in a channel, thereby generating current therein.

That is, a certain amount of voltage (6V) is applied to the drain 41a and a hot electron generated close to the drain 41a is implanted to the floating gate 39, thereby performing the programming action and increasing the threshold voltage of a cell.

On the other hand, the voltage $V_{CG}$ applied to the control gate 42 doesn't affect the channel if there is electron in the floating gate 39. Therefore, the $V_{CG}$ should be more than 6V to generate current.

Meanwhile, when all gates except the erase gate 35a, and source/drains 41a and 41b are grounded, and an erasing voltage of 18V is applied to the erase gate 35a, an FN tunneling current is generated between the floating gate 39 and the erase gate 35a, thereby performing the erasing operation.

At this time, the FN current moves through the third gate oxide film 37 formed over the upper surface and the edge of the erase gate 35a, putting the electrons in the floating gate 39 out. That is, the threshold voltage of the cell decreases.

In addition, a hole trap by a hot hole generated in an erasing operation can be reduced by applying a high voltage to the erase gate 35a formed independently and allowing the source to be grounded. Moreover, the selection gate transistor (not shown) is turned off to block the current path when overerasing occurs.

As aforementioned, the nonvolatile memory device and the method for manufacturing the same according to the present invention have the following advantages.

Since the selection gate transistor blocks current when a certain cell is overerased, it is possible to prevent overerasing from occurring by repeating W/E operation.

Moreover, the characteristic of the memory device can be best realized since the program and erase operation is performed in different regions. Particularly, since a high voltage is applied to the gate for erasing operation, the speed of the erasing operation can be improved.

Finally, since each of the selection gate, the erase gate, the floating gate and the source region is self-aligned, it is possible to obtain high packing density of the memory device.

It will be apparent to those skilled in the art that various modifications and variations can be made in the nonvolatile memory device and method of manufacturing the same according to the present invention without departing from the spirit or scope of the invention. Thus, it is intended that the present invention covers the modifications and variations of the invention provided they come within the scope of the appended claims and their equivalents.

What is claimed is:

1. A nonvolatile memory device comprising:
    a selection gate and an erase gate insulated from each other and aligned with each other on a semiconductor substrate and layered in a first direction;
    a floating gate overlapping one side of the selection and the erase gates; and
    a control gate formed on an entire surface including the floating gate and the erase gate in a second direction, the second direction being perpendicular to the first direction.

2. The nonvolatile memory device as claimed in claim 1, further comprising sidewalls formed at both sides of the selection gate and the erase gate, wherein at least one of the sidewalls is adjacent to both the selection gate and the erase gate.

3. The nonvolatile memory device as claimed in claim 1, further comprising source/drain formed in the semiconductor substrate below the floating gate and the erase gate.

4. The nonvolatile memory device as claimed in claim 1, wherein the selection gate and the erase gate are self-aligned.

5. The nonvolatile memory device as claimed in claim 1, further comprising insulating films formed to cover an upper surface and edges of the erase gate.

6. The nonvolatile memory device as claimed in claim 1, further comprising sidewalls formed at both sides of the selection gate and the erase gate, wherein at least one of the sidewalls has a planar surface, and wherein the planar surface is adjacent to both the selection gate and the erase gate.

7. The nonvolatile memory device as claimed in claim 1, further comprising sidewalls formed at both sides of the selection gate and the erase gate, and further comprising an insulating layer formed between the substrate and the selection gate, floating gate and control gate, but not between the substrate and the sidewalls.

8. The nonvolatile memory device as claimed in claim 1, further comprising a first insulating layer between and adjacent to both the floating gate and the control gate, and further comprising a second insulating layer between and adjacent to both the erase gate and the control gate.

9. The nonvolatile memory device as claimed in claim 1, wherein the floating gate is over only one side of the erase gate.

10. A nonvolatile memory device comprising:
  a first insulating film, a selection gate, a second insulating film and an erase gate layered on a semiconductor substrate;
  sidewalls formed in contact with both sides of the selection and erase gates including the first and second insulating films;
  a third insulating film formed over an upper plane and upper edges of the erase gate;
  a fourth insulating film formed on a surface of the semiconductor substrate at both sides of the sidewalls;
  a floating gate overlapping one side of the erase gate at a certain width;
  a dielectric film formed on the floating gate;
  a source/drain aligned with the floating gate and at least one of the sidewalls, and formed on the surface of the semiconductor substrate; and
  a control gate formed on an entire surface including the erase gate and the floating gate.

11. A method of manufacturing a nonvolatile memory device, comprising:
  layering a first insulating film, a first conductive layer, a second insulating film and a second conductive layer on a semiconductor substrate;
  forming an erase gate having the second conductive layer and a selection gate having the first conductive layer in a first direction, by patterning the second conductive layer, the second insulating film, the first conductive layer and the first insulating film;
  forming sidewalls in contact with both sides of the layered selection gate and erase gate by forming a third insulating film on an entire surface including the selection and erase gate and etching back the third insulating film;
  forming a fourth insulating film over an upper plane and upper edges of the erase gate;
  forming a floating gate overlapping one side of the erase gate at a certain width by forming a third conductive layer on the fourth insulating film and patterning the third conductive layer;
  forming a fifth insulating film on the floating gate;
  forming source/drains in the surface of the semiconductor substrate using the floating gate and the erase gate including the sidewalls as masks; and
  forming a control gate in a second direction vertical to the floating and erase gates by forming a fourth conductive layer on the entire surface including the floating and erase gates and patterning the fourth conductive layer.

12. The method as claimed in claim 11, further comprising forming an insulating film on the surface of the semiconductor substrate before forming the floating gate.

13. The method as claimed in claim 11, wherein the fifth insulating film is formed by layering an oxide/nitride/oxide (ONO) film using the CVD process.

14. The method as claimed in claim 13, wherein the ONO film has a thickness of oxide of 55 Å, nitride of 170 Å, and oxide of 80 Å.

15. The method as claimed in claim 11, wherein the patterning of the second conductive layer, the second insulating film, the first conductive layer and the first insulating layer is performed by photolithography and etching processes so that the selection gate and the erase gate are self-aligned.

16. The method as claimed in claim 11, wherein the second insulating film is formed with a thickness of 1500~2000 Å by the CVD process.

17. The method as claimed in claim 11, wherein the fourth insulating film is formed with a thickness under 250 Å to move the electrons in the floating gate to the erase gate.

18. The method as claimed in claim 11, wherein the first, second, third and fourth conductive layers are formed of a polysilicon layer with a thickness under 2000 Å.

19. The method as claimed in claim 11, wherein the sidewalls are so formed that the upper edges of the erase gate are exposed.

20. The method as claimed in claim 11, further comprising an insulating film for the floating gate on the surface of the semiconductor substrate at both sides of the sidewalls, forming the fourth insulating film.

21. The method as claimed in claim 20, wherein the insulating film for the floating gate is formed with a thickness under 150 Å.

22. A The method as claimed in claim 11, wherein the sidewalls are formed at both sides of the erase gate and selection gate including the first and second insulating films.

* * * * *